(12) United States Patent
Cheng et al.

(10) Patent No.: US 8,675,439 B2
(45) Date of Patent: Mar. 18, 2014

(54) BIT LINE VOLTAGE BIAS FOR LOW POWER MEMORY DESIGN

(75) Inventors: Hong-Chen Cheng, Hsinchu (TW); Jung-Ping Yang, Jui-Bei (TW); Chiting Cheng, Taichung (TW); Cheng-Hung Lee, Hukou Village (TW); Sang H. Dong, Hsin-Chu (TW); Hung-Jen Liao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 210 days.

(21) Appl. No.: 13/271,353

(22) Filed: Oct. 12, 2011

(65) Prior Publication Data

US 2013/0094307 A1     Apr. 18, 2013

(51) Int. Cl.
*G11C 5/14* (2006.01)

(52) U.S. Cl.
USPC ............ 365/226; 365/154; 365/227; 365/203

(58) Field of Classification Search
USPC .................................. 365/154, 226, 227, 203
See application file for complete search history.

(56) References Cited

U.S. PATENT DOCUMENTS 7,272,061 B2 * 9/2007 Saleh ............................ 365/203
7,298,663 B2   11/2007 Houston et al.
7,499,310 B2   3/2009 Park et al.
2008/0285367 A1 * 11/2008 Jung et al. ...................... 365/203
2011/0149666 A1 * 6/2011 Chang et al. ................... 365/203

OTHER PUBLICATIONS

Memory Design II: Low Power SRAMs, Prof. Chris H. Kim, U. of Minn, 2009, course notes, downloaded from http://aboutme.samexent.com/classes/spring09/ee5324/lecture/Lect_04_Memory_6up.pdf.

* cited by examiner

*Primary Examiner* — Vu Le
*Assistant Examiner* — Han Yang
(74) *Attorney, Agent, or Firm* — Duane Morris LLP

(57) ABSTRACT

In a digital memory with an array of bit cells coupled to word lines and bit lines, each bit cell having cross coupled inverters isolated from bit lines by passing gate transistors until addressed, some or all of the bit cells are switchable between a sleep mode and a standby mode in response to a control signal. A bit line bias circuit controls the voltage at which the bit lines are caused to float when in the sleep mode. A pull-up transistor for each bit line BL or BLB in a complementary pair has a conductive channel coupled to a positive supply voltage and a gate coupled to the other bit line in the pair, BLB or BL, respectively. A connecting transistor also can be coupled between the bit lines of the complementary pair, bringing the floating bit lines to the supply voltage less a difference voltage ΔV.

17 Claims, 6 Drawing Sheets

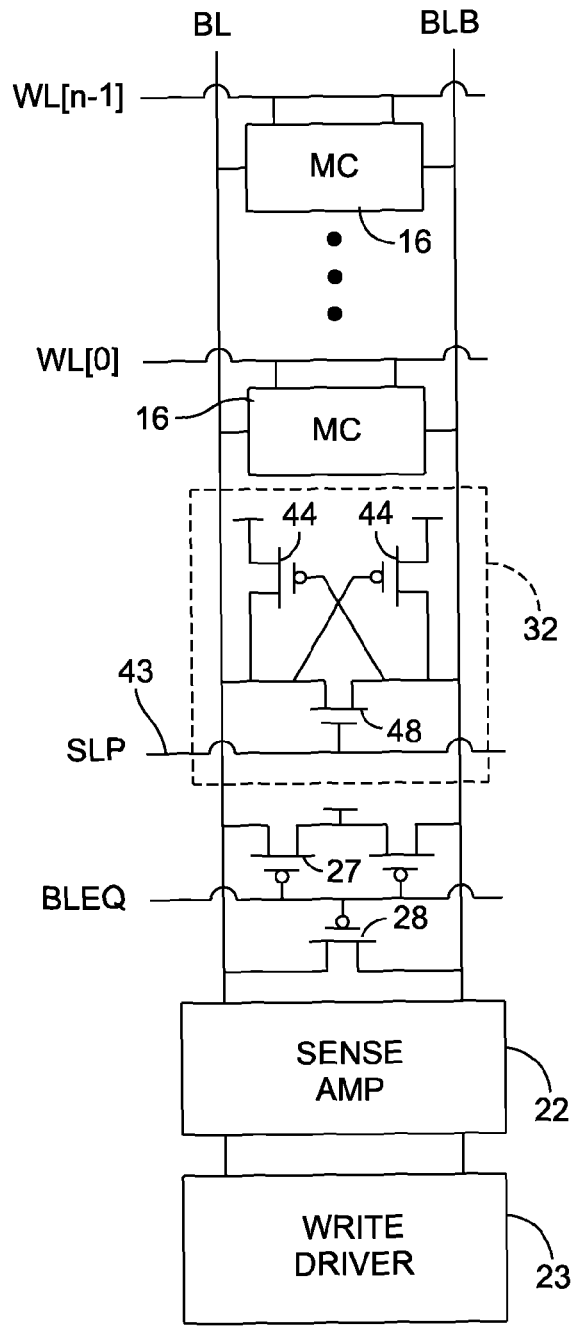
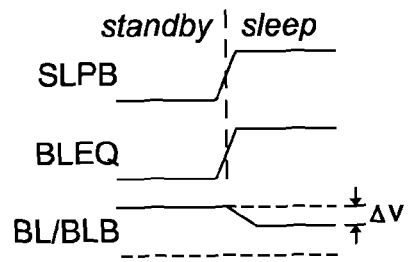
FIG. 7
FIG. 6

BIT LINE VOLTAGE BIAS FOR LOW POWER MEMORY DESIGN

BACKGROUND

This disclosure relates to the field of static random access memories and similar circuits that maintain stored logic levels while power is applied, in particular with provisions to reduce power consumption when in an inactive or "sleep" mode. Bit lines are biased in sleep mode according to several embodiments, so as to facilitate switching into a standby mode for read or write operations, without an undue inrush of current to power up.

So long as power is applied to a volatile memory bit cell, the logic level of the bit cell is stable. Typically, two cross-coupled inverters hold one another in a present logic state that can be read out using a sense amplifier. The inverters can be forced by a write driver to switch to an opposite logic state, and then remain stable in that logic state. A sense amplifier and a driver are provided at each bit position in a bit cell array having plural word lines. For example, an array might have 256 bit positions and 256 word lines, or some other number. One word line is selected at a time by asserting a word line signal at all the bit cells along the associated word line, for read or write operations determined by logic values applied to or read from the bit lines.

The inverters can be isolated from the addressing lines by passing gate transistors. In a six transistor (6T) bit cell configuration, for example, the nodes at which two inverters are cross coupled (connected input-to-output) are isolated from two complementary bit lines BL, BLB by the source/drain channel of two passing gate transistors, each typically an NMOS field effect transistor (FET). When the associated word line signal WL is asserted at the gate of the passing gate FETs, the inverter nodes are coupled to the bit lines.

The inputs and outputs of the cross coupled inverters, which are the bit cell nodes, are not actively coupled externally until the bit cell is addressed by the word line and bit line signals that cross at the bit cell. The value stored in the bit cell is thereby protected while the bit cells associated with other word lines are being read or written. Reading from a bit cell involves pre-charging the bit line signals for the corresponding bit cell position for all the word lines and discerning the logic levels when the passing gates are rendered conductive at a selected word line. Writing to a bit cell involves applying bit line voltages when the passing gates are conductive, to cause the cross coupled inverters to assume a desired logic state.

However the bit cells are subject to current leakage to a degree and along leakage paths that depend in part on the voltages at the bit cell nodes, and at the bit lines BL, BLB. Where a potential difference exists across the source/drain or gate/substrate of the transistors of the inverters or passing gates, some current leakage occurs. In a low power SRAM, it would be advantageous to reduce or eliminate current leakage. According to some techniques, the bit line voltages BL, BLB (which are isolated from the inverters by the passing gates) can be allowed to float when in a sleep mode and are precharged when switched into a ready or standby mode. But it will generally be the case that a potential difference exists between the bit cell nodes and the bit lines. The bit cell nodes are at complementary logic levels, one being at the cell positive supply voltage and the other being at the cell negative supply voltage. The bit cells at different word lines may have either logic state and are coupled to the same bit lines at each bit position. If all the bit cells at a given bit position happened to have the same logic level (the same data value), then minimum leakage might be obtained by floating the bit lines BL, BLB at the corresponding cell supply voltages. But the bit cells can have any arbitrary logic level. It would be advantageous if the bit lines could be controlled to float at levels that minimize leakage by adapting to the logic levels that happen to be stored in the bit cells.

Precharging of the bit lines, for example in preparation for a read operation, can be accomplished by applying a control voltage signal BLEQ, such as a $V_{SS}$ low voltage level, to the gates of two PMOS FETs that operate as pull-up switches. Each FET respectively couples one of the complementary bit lines BL, BLB to the positive supply $V_{DD}$. The gate of a third PMOS FET can couple the bit lines BL, BLB to one another such that both bit lines are brought to equal voltages. When the read operation occurs, the imbalance in current to the opposite nodes of the cross coupled inverters is sensed to determine the bit cell logic state. Such sensing would be less dependable if the bit line voltages were unequal upon commencement of a read operation.

Isolating the nodes of the bit cell at the inputs/outputs of the cross coupled inverters, and also allowing the bit lines to float until a bit cell position is addressed, reduces but does not eliminate current leakage. Leakage paths remain, but depend on which of the cross coupled inverters is held in which of the two possible logic states. The leakage paths include FET drain/source leakage and gate leakage according to the different voltage bias conditions inherent in a logic state.

According to one technique for limiting power dissipation, an SRAM bit cell array can be partitioned into banks. Unused banks of bit cells can be maintained in a "sleep mode" until needed. The sleep mode can be associated with reduced potential difference across the bit cell power supply terminals, e.g., a reduced positive supply voltage $V_{DD}$ and/or an increased negative supply voltage $V_{SS}$ (nominally ground potential), so that leakage is reduced because the bit cells are subjected to reduced voltage bias that is minimally sufficient to maintain the bit cell logic values. When a bit cell or bank is to be switched from sleep mode into a standby mode and ready to be accessed for read or write operations, the bit cell power supply voltages must be restored to nominal levels. Floating bit lines BL, BLB must be precharged for read operations. These restoration steps when switching from the sleep mode to the ready or standby mode and preparing for a memory access operation, take time that can adversely affect the maximum operational speed. Restoration steps also consume power, and require that the power supply and its conductors have sufficiently high capacity and sufficiently low IR voltage drops, to handle the increased loading associated with switching into the standby-ready mode.

It would be advantageous to provide improved techniques for managing the voltages on bit lines BL, BLB when in the sleep and standby modes, to minimize current leakage, and to ease the load of switching into the standby mode for commencing a memory access operation.

SUMMARY

It is an object of the disclosed embodiments to provide a bit line voltage bias circuit, active during the sleep mode, to manage the voltages at which bit lines are permitted to float.

According to one aspect, a bit line biasing circuit is coupled between the complementary bit lines BL, BLB and also between each of the bit lines BL, BLB and the positive supply $V_{DD}$ using a cross coupling configuration of FETs that bring both bit lines BL, BLB, when they are floating, close to the voltage of the positive supply, i.e., $V_{DD}$ less a difference voltage $\Delta V$. Pull-up switching transistors are used to bring up the voltages at bit lines BL, BLB, but the gate of the pull-up transistor for each bit line BL, BLB is cross coupled to the other bit line. The configuration thereby adapts to the logic levels of all the bit cells at a corresponding bit position in the bit cell array.

In different embodiments, the cross coupling configuration can involve a connecting PMOS transistor between the complementary bit lines BL, BLB with a gate coupled to a standby/sleep signal (low in the sleep mode and high in the standby mode). Two PMOS transistors respectively couple each bit line BL or BLB to the positive supply $V_{DD}$, and each has a gate coupled to the opposite bit line BLB or BL. A connecting NMOS transistor instead of a connecting PMOS transistor also can be used if the standby/sleep signal is high in the sleep mode and low in the standby mode. In still another embodiment, complementary sleep (SLP) and not-sleep (SLPB) signals can be coupled to both NMOS and PMOS parallel connecting transistors.

Among other advantages, the respective embodiments facilitate switching quickly from the sleep mode to the standby mode upon transition of the SLP signal (and optionally also a complementary SLPB signal). In preparation for a read operation, for example, the transition in SLP/SLPB is accompanied by a transition in the bit line precharge signal BLEQ, for bringing both bit lines BL, BLB up to the supply voltage $V_{DD}$. However, the change to standby mode is not accompanied by as large a rush of current at either BL or BLB as would occur in the absence of bit line bias control, because the bit line bias control configuration has maintained the bit line voltages near the positive supply voltage, namely at $V_{DD}$ less difference voltage $\Delta V$.

The foregoing and other objects and aspects are exemplified in this disclosure by a digital memory with an array of bit cells coupled to word lines and bit lines, each bit cell having cross coupled inverters isolated from bit lines by passing gate transistors until addressed, some or all of the bit cells are switchable between a sleep mode and a standby mode in response to a control signal. A bit line bias circuit controls the voltage at which the bit lines are caused to float when in the sleep mode. A pull-up transistor for each bit line BL or BLB in a complementary pair has a conductive channel coupled to a positive supply voltage and a gate coupled to the other bit line in the pair, BLB or BL, respectively.

Advantageously, a connecting transistor is coupled between the bit lines of the complementary pair and is responsive to the control signal for coupling the bit lines to one another when in the sleep mode. The effect is to bring the floating bit lines to equal voltages substantially at the supply voltage less a difference voltage $\Delta V$. The difference voltage is less than the difference between logic states. Preliminarily fixing the floating bit line voltages at the supply voltage less $\Delta V$, reduces the inrush of current that could be experienced at one or more bit positions when switching into the standby-ready mode.

Exemplary embodiments are described wherein cross coupled pull up transistors and connecting transistors are embodied using P and N type MOS transistors, and using one connecting transistor or two complementary connecting transistors. These are operated in connection with or in coordination with the control signal that switches the bit cells of the array, or a subset such as an addressable bank of bit cells, between the sleep and standby modes, and optionally also controls precharging of the bit lines BL, BLB when commencing a memory access operation.

BRIEF DESCRIPTION

There are shown in the drawings certain exemplary embodiments intended to illustrate aspects of the subject matter disclosed. The subject developments are not limited to the embodiments illustrated as examples, and reference should be made to the claims to assess the scope of the subject matter. In the drawings, FIG. 1 is schematic diagram showing an SRAM according to the present disclosure, with a bit line voltage bias circuit associated with the bit lines BL, BLB of memory bit positions.

FIG. 6 is a schematic diagram corresponding to FIG. 3 but showing an alternative exemplary embodiment of the bit line bias circuit, using an NMOS connecting transistor.

FIG. 7 is a timing diagram for use in reference to FIG. 6.

DETAILED DESCRIPTION

Figure 1:
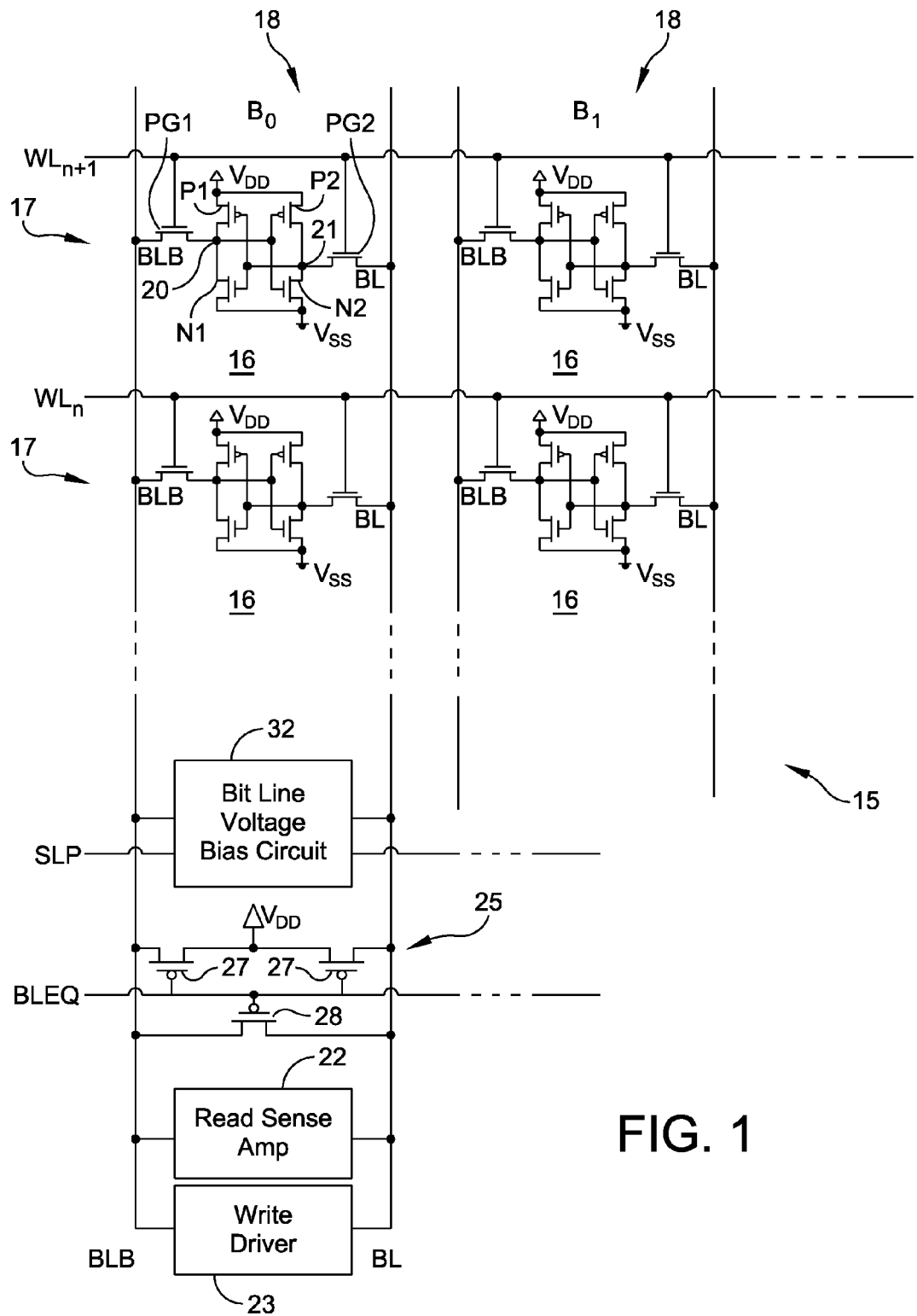

In FIG. 1, a six-transistor (6T) bit cell in a CMOS SRAM (complementary metal oxide semiconductor static random access memory) 15 is shown as an example of an integrated circuit memory device that stores one bit per bit cell 16. Numerous bit cells are provided in a memory array shown with rows or words 17 and columns or bit positions 18 in the words. A row 17 of bit cells 16 is selected by activating a word line signal WL for that row. The logic levels of the bit cells 16 in the row 17 are loaded (written) or sensed (read) by signals on bit lines BL and BLB that cross the word line at each selected bit cell position in the array.

The cells 16 have four transistors forming two cross coupled inverters, each inverter having a PMOS transistor and an NMOS transistor coupled to one another at a node, and the inverter connected between positive and negative power supplies $V_{DD}$, $V_{SS}$. The cell nodes 20, 21 are isolated from the complementary bit lines BL and BLB by passing gate switching transistors PG1, PG2, until their associated word line signal WL is switched to conduct, by a high level on word line WL. Although the nodes 20, 21 and the inverters coupled to them are isolated by the passing gate transistors, there is some current leakage. The data values in the bit cells are stored by the cross coupled inverters as a logic value and its complement. Either a logical zero value or a logical one value might by stored in any given bit cell 16 and considering all the bit cells associated with a set of bit lines (i.e., considering any given bit position 18 at all the associated word positions), any proportion of the bit cells might be storing logical ones or zeros. Channel leakage and/or gate leakage currents can arise. The proportion of logical ones and zeros might lead to leakage current that is balanced more to the BL side or the BLB side. What is needed is an optimal way to manage the bit cells to minimize the total current leakage associated with the SRAM.

Each bit cell comprises two inverters. Each inverter has a pair of field effect transistors (FETs) arranged as an NMOS and PMOS complementary pair having their gates coupled together at a node 20 or 21 forming the input to the inverter. The source/drain terminals of the complementary transistors are coupled to one another at an output node of the inverter. The complementary transistors are coupled serially between a relatively more positive voltage supply $V_{DD}$ and relatively more negative voltage supply $V_{SS}$ (the latter typically at ground potential). One of the transistors (e.g., P1 or N1) is conductive and the other is nonconductive, depending on whether the input node is above or below a voltage threshold. The conductive transistor brings the voltage at the node 20 or 21 to either $V_{DD}$ or $V_{SS}$. Because the inverters are cross coupled, the logic levels at the two nodes 20, 21 are opposite (i.e., complements).

Provided that the power supply voltages $V_{DD}$ or $V_{SS}$ remain available at some minimum level, the two inverters hold one another in one of two possible logic states at which the bit cell is stable. That is, the logic value stored in the bit cell remains in the state where it was left, until forced to switch to the opposite logic state, whereupon the inverters become stable at the new logic state. The bit cell stores one bit of information that can be read or written.

Access for read and write operations is provided by activating the word line signal WL associated with a row 17 of bit cells 16, and the read or write operation is effected based on the voltages on the two bit lines BL, BLB that are respectively coupled to the nodes 20, 21 of the cross coupled inverters through the two NMOS FET passing gate transistors PG1, PG2. The two passing gates respectively connect the bit cell nodes to a bit line signal BL and to a bit line complement signal BLB. (The bit line complement BLB may alternatively be identified as BL-Bar or BLN or BL-not, etc.)

Each bit position and each pair of bit lines BL, BLB have a read sense amplifier 22 and a write driver 23. In a write or bit storage operation, the write driver can impose a logic level on a bit cell 16 by applying complementary high and low voltages on bit lines BL, BLB when the corresponding word line signal WL has made the passing gate transistors PG1, PG2 conductive. The voltages are applied at sufficient power level and time to force the inverters to change state, if necessary, and assume a required logic value.

For a read operation, a sense amplifier 22 senses the logic state stored in the inverters when the word line WL is asserted. In order to accomplish the read operation, both bit lines BL and BLB are precharged to the high supply voltage $V_{DD}$ by a bit line precharge circuit 25 comprising two PMOS pull-up transistors 27, each coupled between one of the bit lines and the $V_{DD}$ supply voltage, and a connecting transistor 28 coupled between the bit lines BL, BLB. When the bit lines are precharged to an equal high voltage by applying a low level at signal BLEQ, and word line signal WL is asserted (by a high logic level at the row 17 to be read out), the passing gate FETs PG1 and PG2 become conductive and couple the nodes 20, 21 of the cross-coupled inverters to the bit lines BL and BLB. One of the inverter nodes is high and the other is low, leading to a discharge of current through one of the nodes, depending on the logic state of the bit cell. The sense amplifier 22 coupled to the bit lines BL, BLB discerns the logic level stored in the addressed bit cell by comparing the responses of the two nodes. The reliability of the read operation depends in part on precharging the bit lines to equal voltages and on the two inverters in the bit cell being reasonably balanced, i.e., approximately equal as to their voltage switching thresholds and the like.

According to another aspect of the SRAM or similar digital memory as shown, provisions are made for further control of the bit line voltages, so as to minimize leakage, e.g., in a low power memory design. As shown in FIG. 1, a bit line voltage bias circuit is coupled to each column or bit position 18 at the bit lines BL, BLB, and operated by a control signal SLP for switching between a sleep mode and a standby mode. The source of the control signal can be a control processor or circuit (not shown) that switches an entire memory bank or a partitioned portion of a memory into sleep mode when it is not immediately needed. The bit line voltage bias circuit 32 is coupled to all the bit cells in a particular bit position or column in FIG. 1, and thus all the bit cells in that column are switched into or out of sleep mode as a group.

The bit cells form an array coupled to crossing word lines and bit lines. A word line signal at a selected one of the word lines $WL_n$ selects a plurality of bit cells that comprise an addressable word in the array, namely a row 17. The bit line signals BL, BLB control reading and writing at bit positions along the addressable words selected by the word lines, namely being used in conjunction with the read sense amplifier 22 for reading or with the write driver 23 for writing.

Figure 2:
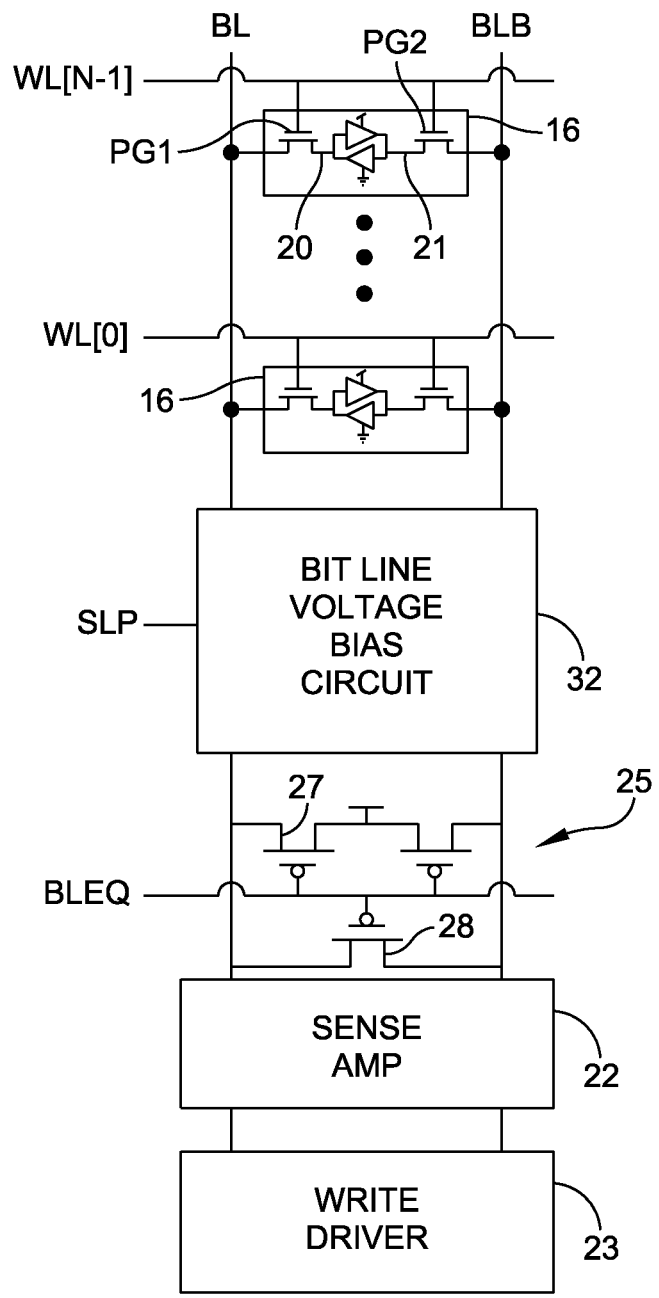
FIG. 2 is a schematic showing one bit position in an SRAM as described, wherein the bit cells are shown generally as blocks.

FIG. 2 is a simplified schematic showing one bit position, it being understood that the other bit positions are substantially the same. The bit cells comprise inverters, now shown symbolically, that are cross coupled between complementary nodes 20, 21, each coupled to a passing gate transistor PG1 or PG2. The passing gate transistor for either bit line BL, BLB has a gate coupled to the word line WL and is enabled to conduct by a signal at the selected one of the word lines. The word line signal thus opens the a conductive channel of passing gate transistor PG1, PG2 between one of the bit lines BL, BLB and one of the nodes 20, 201 when a word line is addressed. The passing gate transistors PG1, PG2 are non-conductive when the word line signal is not asserted, and isolate the nodes 20, 21 from the bit lines BL, BLB.

At least a subset of the bit cells 16 in the SRAM array is switchable between a sleep mode and a standby or ready mode via a control signal. The bit cells in the subset are accessible for one of read and write operations when in the standby mode, namely by asserting their word line signal.

Figure 3:
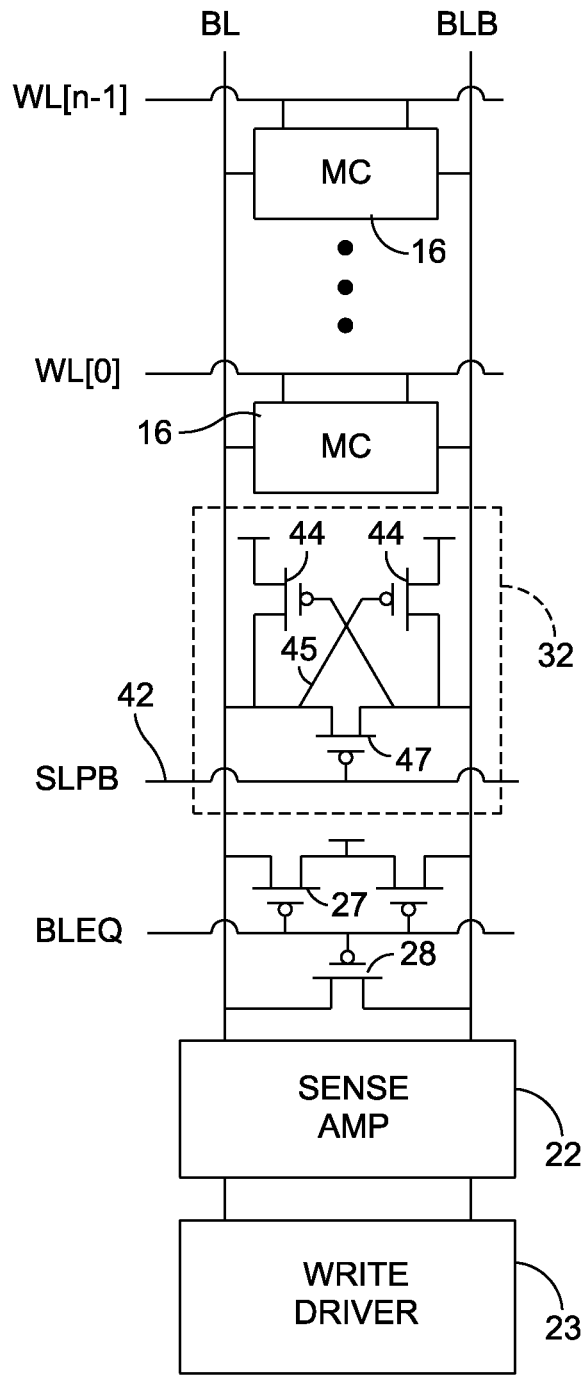
FIG. 3 is a schematic diagram showing an SRAM bit position having a bit line bias circuit according to an exemplary embodiment.
Figure 5:
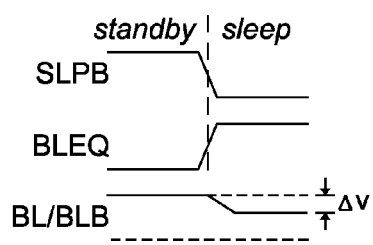
FIG. 5 is a comparative timing diagram showing a control signal SLPB for switching between sleep and standby mode, compared to a bit line precharge control signal BLEQ and showing the effect of the disclosed bit line bias circuit on the bit line voltages BL, BLB, especially when floating in the sleep mode.

The bit line bias circuit 32 is operational in the sleep mode. Referring to FIGS. 3 and 5, the bit line bias circuit in one embodiment comprises pull-up transistors 44 for each of the bit lines in the subset, coupled between the bit lines BL or BLB and a supply voltage, and rendered conductive by the control signal. A pair of bit lines (BL, BLB) is provided for each bit position in the array. The passing gate transistors isolate the inverter in each bit cell. The channels of the pull up transistors couple the bit lines in the pair to the supply voltage switched into conductive mode. When the low-true sleep mode signal SLPB is low (namely at $V_{SS}$), a connecting transistor 47 couples the bit lines BL, BLB to one another. The pull-up transistors 44 are cross coupled in that the pull up transistors coupled one of the bit lines BL or BLB to the positive supply but are controlled by the gates of each pull up transistor being coupled to the opposite bit line BL or BLB from the side that is pulled up. The effect of the circuit is to elevate the voltage on the bit lines when in the sleep mode to near the supply voltage, but not entirely to precharge the bit lines, which is the function of the circuit responsive to precharge signal BLEQ, coupled to pull up transistors 27 and connecting transistor 28 as shown in FIG. 3, in a way that is not cross coupled. More particularly, the bit lines are held at the positive supply less a difference voltage $\Delta V$.

Figure 4:
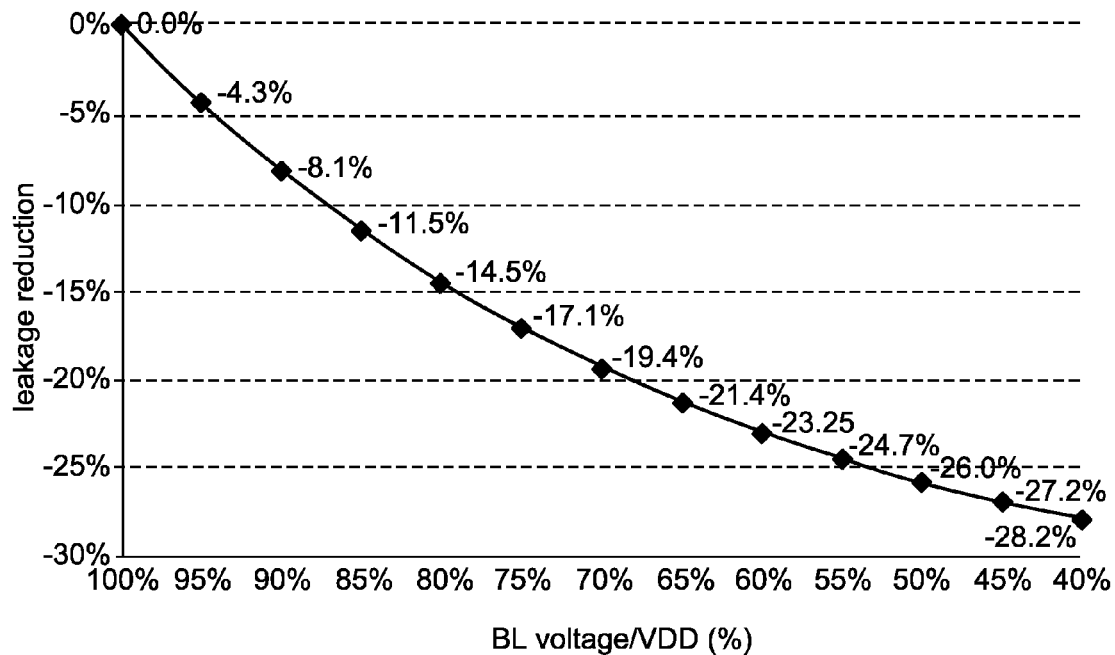
FIG. 4 is a graph relating leakage reduction to bit line voltage as a percentage of supply voltage $V_{DD}$.

FIG. 4 shows that holding the bit line voltages at an elevated voltage in the sleep mode reduces leakage considerably. The extent of actual leakage is due in part to the logic values stored in the bit cells. However if the bit line voltage can be increased, the forward source/drain bias on the passing gate transistors 20, 21 (see FIG. 2) is reduced. In the example shown, elevating the bit line voltages to 50 to 75% of $V_{DD}$ can reduce leakage as much as 20 to 25%.

The bit lines in the pair are a complementary pair of which both bit lines are precharged for at least one memory access operation, for example when the passing gates are switched on for reading the bit cell data bit value. In a state where BLEQ has precharged both bit lines, the pull up transistors 44 of the bit line bias circuit are switched off. Likewise, in the standby mode the base of connecting transistor 47 is at a high level and the connecting transistor is also turned off. The precharge-and-read operation is not adversely affected by the bit line bias circuit.

In a write mode, the write driver 23 applies complementary voltages to the bit lines. Because signal SLPB is high in the standby-ready mode, connecting transistor 47 is non-conductive when read and write operations occur. Thus the bit line voltage bias circuit 32 does not interfere with the operation of the write driver to impose a logic state on the bit cell by applying a high level to one of the bit lines and a low level to the other of the bit lines. Also, the pull-up transistors 44 are cross coupled such that the base of the pull-up transistor 44 of one bit line is coupled to the opposite bit line. When in the read or write mode and due to the complementary logic states represented by high and low voltages on the bit lines BL, BLB, the pull-up transistor that is coupled to the bit line at the higher voltage ($V_{DD}$) has its base coupled to the other bit line at the lower voltage ($V_{SS}$). As a result, the PMOS pull-up transistor on the high voltage bit line is conductive and pulls up the bit line to $V_{DD}$. The PMOS pull-up transistor on the complementary low voltage bit line has its base coupled to the high voltage other bit line and therefore is turned off (i.e., is not conductive). In this way, the bit line voltage bias circuit that maintains an elevated voltage of $V_{DD}$ less $\Delta V$ on both bit lines in the sleep mode, is turned off in the standby-ready mode as to the connecting transistor 47, and either reinforces or at least does not adversely affect the read and write operations in the standby-ready mode. The amplitude of voltage $\Delta V$ is roughly the threshold voltage of transistor 44, and varying the structure of transistor 44 to obtain a larger or smaller threshold correspondingly changes the $\Delta V$ value and the voltage ($V_{DD}$ less $\Delta V$) at which the bit lines BL, BLB are held.

FIGS. 6 and 7 illustrate an alternative arrangement wherein the bit line bias circuit 32 comprises a connecting transistor 48 coupled between the bit lines of the complementary pair of bit lines BL, BLB, and wherein a control signal is coupled to a gate of the connecting transistor such that the bit lines of the complementary pair are conductively coupled in the sleep mode. In FIG. 6, the connecting transistor is NMOS transistor 48 and the control signal SLP 43 is high true in the sleep mode. In other respects, this embodiment operates in the manner described with respect to FIG. 3. The connecting transistor is conductive in the sleep mode, coupling the bit lines BL, BLB together. The pull-up transistors 44 are cross coupled such that the voltage on either of the bit lines is coupled to the base of the PMOS transistor 44 on the other bit line, causing both bit lines to reside in sleep mode at an elevated voltage $V_{DD}$ less $\Delta V$. More particularly, the pull-up transistor 44 for each member of the complementary pair of bit lines BL, BLB in this example is a PMOS FET with a channel coupled between that bit line and the supply voltage $V_{DD}$, and a gate coupled to the other of the complementary pair of bit lines. The bit line bias circuit is active in the sleep mode to bias the bit lines to the supply voltage but for the voltage difference, and is inactive in the standby mode.

Figure 8:
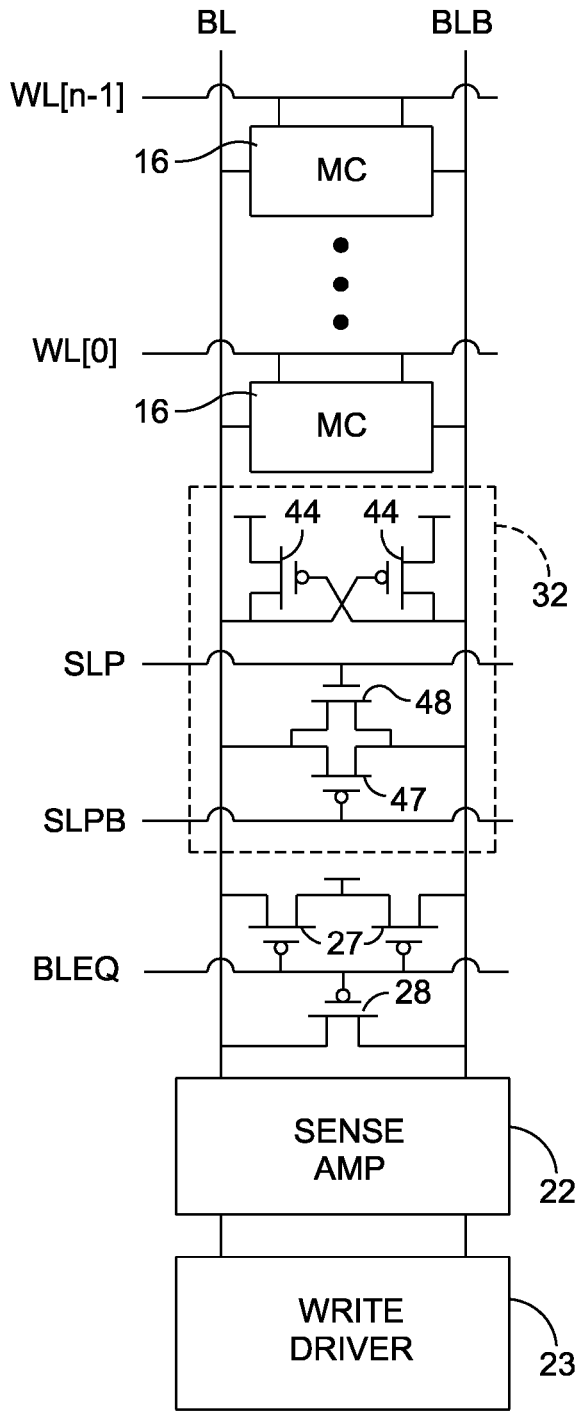
FIG. 8 is a schematic diagram showing an alternative embodiment of the bit line bias circuit using complementary switching transistors.
Figure 9:
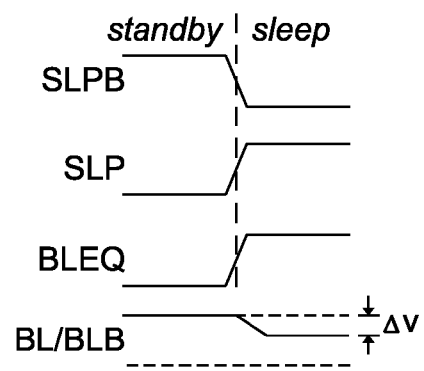
FIG. 9 is a timing diagram corresponding for use in reference to FIG. 8.

FIGS. 8 and 9 illustrate a further embodiment wherein the connecting transistor(s) coupling together the bit lines BL, BLB in the sleep mode are configured to provide functions similar to the embodiments of FIGS. 3 and 6, but two connecting transistors are illustrated in FIG. 8 and are shown as separate from the pull-up transistors 44 that are cross coupled to pull up both bit line voltages in the sleep mode. In this embodiment, BL and BLB are connected by both a PMOS transistor 47 with a gate coupled to a low-true control signal SLPB and an NMOS transistor 48 coupled to a high-true control signal SLP as well. Although pull-up transistors 44 are shown separate, they are cross coupled to the bit lines BL, BLB in the same way as in FIGS. 3 and 6.

In each of the disclosed embodiments, the bit line voltage bias circuit is active alternately with the bit line precharge circuit, the bit line voltage control being active in the sleep mode and the bit line precharge control signal (BLEQ) being active to precharge the bit lines at least for read operations in the standby-ready mode. The bit line precharge circuit likewise comprises a connecting transistor 28 having a channel coupling between the bit lines BL, BLB and two pull-up transistors 27 coupling each of the bit lines (BL, BLB) to the $V_{DD}$ supply voltage. The gates of each of the connecting transistors 28 and the pull-up transistors for said bit lines (BL, BLB) are coupled to the precharge control signal at least in one phase of operation in the standby mode, rather than being cross coupled to the opposite bit line as in the bit line voltage bias circuit 32. Also, the BLEQ signal, which is low true, is only active in the standby-ready mode and is off (high) in the sleep mode. The cross coupled pull-up transistors 44 and the connecting transistor(s) 47, 48 of the bit line bias circuit include PMOS FETs and the control signal for switching between the sleep mode and the standby mode is low in the sleep mode for activating the bit line bias circuit and high in the standby mode for deactivating the bit line bias circuit. Accordingly, the control signal for switching between the sleep mode and the standby mode is high in the sleep mode for activating the bit line bias circuit and low in the standby mode for deactivating the bit line bias circuit. Or in the embodiment of FIG. 8, both high true and low true control signals SLP and SLPB are coupled to NMOS and PMOS connecting transistors 48, 47 and reinforce the connection. More particularly, both the PMOS and NMOS transistors each can conduct in their linear regions, contributing to bringing the bit line voltages to an elevated voltage that minimizes leakage associated with the passing gate transistors PG1, PG2 and the transistors forming the inverters of the bit cells at the associated bit position in the SRAM array.

The disclosed bit line voltage bias circuit is inactive when memory access operations are effected during the standby-ready mode. In the standby-ready mode, the sense amplifier 22 is operable to read an addressable word when selected, and the write driver 23 is operable to write to an addressed word. These operations are not affected when in the standby-ready mode because in standby-ready mode, the connecting transistor(s) 47 and/or 48 of the bit line bias circuit are nonconductive. In a read phase of the standby-ready mode, the cross coupled pull-up transistors 44 of the bit line bias circuit are nonconductive because both bit lines are precharged to $V_{DD}$ (i.e., in preparation for a read operation). In the write phase of the standby-ready mode, the cross coupled pull-up transistors couple the high bit line to $V_{DD}$ and decouple the low bit line from $V_{DD}$, accommodating a situation in which either of the bit lines is high due to the logic state to be written.

The disclosed techniques can be regarded as a method as well as an apparatus. The method biases bit lines (BL, BLB) in a digital memory having an array of bit cells 16 coupled to word lines WL and said bit lines, wherein a word line signal at a selected one of the word lines selects a plurality of bit cells (a row in the examples shown) that comprise an addressable word in the array, and signals on the bit lines BL, BLB control reading and writing at bit positions 18 along the addressable words selected by the word lines. The method comprises switching at least one subset of the bit cells in the array between a sleep mode and a standby mode via a control signal SLP, the bit cells in the subset being accessible for one of read and write operations when in the standby mode. Responsive to the control signal, the bit lines BL, BLB in the subset are coupled to a supply voltage $V_{DD}$ via a pull-up transistor when in the sleep mode, thereby minimizing current leakage in the bit cells.

The bit lines are complementary bit lines (BL, BLB), i.e., one being high and the other low for certain operations including reading out the data value in the standby-ready mode. The method further includes coupling the complementary bit lines to one another when in the sleep mode. The result of coupling the bit lines together and pulling both bit lines up to the positive supply voltage $V_{DD}$ when in the sleep mode, while the bit cells are isolated by nonconductive passing gate transistors PG1, PG2 (because the word line is not asserted), is that the bit lines BL, BLB are biased to assume an elevated voltage ($V_{DD}$ less $\Delta V$), that is a higher voltage that would be assumed otherwise if the bit lines were allowed to float, thus reducing current leakage in the sleep mode.

According to this technique, the complementary bit lines BL, BLB are concurrently pulled up relative to a positive supply voltage $V_{DD}$ by pull-up transistors 44 and connected to one another through one or more connecting transistors 47, 48. Advantageously, the pull-up transistors 44 are PMOS transistors that are cross coupled between the complementary bit lines BL, BLB, in that the gates of the PMOS pull up transistor 44 of each of said complementary bit lines BL or BLB is coupled to the other one of the complementary bit lines. The respective transistors are responsive to one or more control signals SLP, SLPB. Coupling the complementary bit lines BL, BLB to one another comprises one of coupling a PMOS transistor to the control signal that is low-true in the sleep mode, coupling an NMOS transistor to the control signal that is high-true in the sleep mode, or both, namely coupling complementary high-true and low-true control signals to both of a PMOS transistor and an NMOS transistor.

The subject matter has been disclosed in connection with exemplary embodiments and examples. It should be understood that the subject matter is not limited to the examples, and reference should be made to the appended claims to assess the scope of the invention in which exclusive rights are claimed.

We claim:

1. A digital memory, comprising:
    an array of bit cells coupled to word lines and bit lines, wherein a word line signal at a selected one of the word lines selects a plurality of bit cells that comprise an addressable word in the array, and bit line signals control reading and writing at bit positions along the addressable words selected by the word lines;
    wherein the bit cells comprise inverters that are cross coupled between complementary nodes, and at least one passing gate transistor, the passing gate transistor having a gate coupled to the word line signal at the selected one of the word lines, controlling a channel between one of the bit lines and one of the nodes, whereby the passing gate transistors isolate the nodes from the bit lines until an associated one of the word lines is asserted to couple the bit lines of the addressable word to the nodes of the inverters of the addressable word, through the channel of the passing gate transistors;
    wherein at least one subset of the bit cells in the array is switchable between a sleep mode and a standby mode via a control signal, the bit cells in the subset being accessible for one of read and write operations when in the standby mode;
    a bit line bias circuit operational in the sleep mode, comprising a pull-up transistor for the bit lines in the subset, coupled between the bit lines and a supply voltage, and rendered conductive by the control signal, wherein the pull-up transistor for each of a complementary pair of bit lines has a channel coupled to a supply voltage and a gate coupled to the other of the complementary pair of bit lines.

2. The digital memory of claim 1, comprising a pair of bit lines (BL, BLB) for each bit position in the array, wherein channels of two passing gate transistors respectively couple the nodes of the inverters to each of the bit lines in the pair.

3. The digital memory of claim 2, wherein the bit lines in the pair are a complementary pair of which both bit lines are precharged for at least one memory access operation.

4. The digital memory of claim 3, wherein the bit line bias circuit further comprises a connecting transistor coupled between the bit lines of the complementary pair, and wherein the control signal is coupled to a gate of the connecting transistor such that the bit lines of the complementary pair are conductively coupled in the sleep mode.

5. The digital memory of claim 4, wherein the supply voltage is a positive supply voltage.

6. The digital memory of claim 1, wherein the bit line bias circuit is active in the sleep mode to bias the bit lines to the supply voltage but for a voltage difference, and is inactive in the standby mode.

7. The digital memory of claim 6, further comprising a bit line precharge circuit active in the standby mode responsive to a precharge control signal (BLEQ) to precharge the bit lines, the bit line precharge circuit comprising a connecting transistor having a channel coupling between the bit lines and two pull-up transistors coupling each of the bit lines (BL, BLB) to a supply voltage, wherein gates of each of the connecting transistor and the pull-up transistor for each of said bit lines (BL, BLB) are coupled to the precharge control signal at least in one phase of operation in the standby mode.

8. The digital memory of claim 2, further comprising a bit line precharge circuit active in the standby mode responsive to a precharge control signal (BLEQ) to precharge the bit lines, the bit line precharge circuit comprising a connecting transistor having a channel coupling between the bit lines and two pull-up transistors coupling each of the bit lines (BL, BLB) to a supply voltage, wherein gates of each of the connecting transistor and the pull-up transistor for each of said bit lines (BL, BLB) are coupled to the precharge control signal at least in one phase of operation in the standby mode.

9. The digital memory of claim 6, wherein the pull-up transistors and the connecting transistor of the bit line bias circuit are PMOS FETs and the control signal for switching between the sleep mode and the standby mode is low in the sleep mode for activating the bit line bias circuit and high in the standby mode for de activating the bit line bias circuit.

10. The digital memory of claim 6, wherein the pull-up transistors of the bit line bias circuit are PMOS FETs and the connecting transistor of the bit line bias circuit is an NMOS FET, and wherein the control signal for switching between the sleep mode and the standby mode is high in the sleep mode for activating the bit line bias circuit and low in the standby mode for de activating the bit line bias circuit.

11. The digital memory of claim 6, comprising two said connecting transistors, one of the connecting transistors being a PMOS FET and an other of the connecting transistors being an NMOS FET, wherein the pull-up transistors and the connecting transistor of the bit line bias circuit are PMOS FETs and the control signal for switching between the sleep mode and the standby mode comprises complementary logic components coupled to the respective connecting transistors for activating the bit line bias circuit in the sleep mode and deactivating the bit line bias circuit in the standby mode.

12. The digital memory of claim 1, further comprising a bit line precharge circuit operable in the standby mode responsive to a control signal BLEQ to pull up both bit lines to a positive supply voltage.

13. The digital memory of claim 12, further comprising a sense amplifier operable in to read the addressable word when selected in the standby mode and a write driver operable to write to the addressable word when selected in the standby mode.

14. A method for biasing bit lines (BL, BLB) in a digital memory having an array of bit cells coupled to word lines and said bit lines, wherein a word line signal at a selected one of the word lines selects a plurality of bit cells that comprise an addressable word in the array, and bit line signals control reading and writing at bit positions along the addressable words selected by the word lines, the method comprising:
  switching at least one subset of the bit cells in the array between a sleep mode and a standby mode via a control signal, the bit cells in the subset being accessible for one of read and write operations when in the standby mode;
  responsive to the control signal, coupling the bit lines in the subset to a supply voltage via a pull-up transistor when in the standby mode, wherein the pull-up transistor for each of a complementary pair of bit lines has a channel coupled to a supply voltage and a gate coupled to the other of the complementary pair of bit lines.

15. The method for biasing bit lines of claim 14, wherein the bit lines are complementary bit lines (BL, BLB) and further comprising coupling the complementary bit lines to one another when in the standby mode.

16. The method for biasing bit lines of claim 15, comprising concurrently pulling up the complementary bit lines relative to a positive supply voltage and connecting the complementary bit lines together, using PMOS pull up transistors on each of the complementary bit lines, and coupling gates of the PMOS pull up transistor of each of said complementary bit lines to the other of the complementary bit lines.

17. The method for biasing bit lines of claim 16, wherein coupling the complementary bit lines together comprises one of coupling a PMOS transistor to the control signal when low-true in the sleep mode, coupling an NMOS transistor to the control signal when high-true in the sleep mode, and coupling complementary high-true and low-true control signals to both of a PMOS transistor and an NMOS transistor.

* * * * *